United States Patent
Mutou et al.

(10) Patent No.: US 9,734,983 B2
(45) Date of Patent: Aug. 15, 2017

(54) CHARGED PARTICLE RADIATION APPARATUS

(71) Applicant: Hitachi High-Technologies Corporation, Minato-ku, Tokyo (JP)

(72) Inventors: Daisuke Mutou, Tokyo (JP); Shuichi Nakagawa, Tokyo (JP); Masaki Mizuochi, Tokyo (JP); Toshihiko Shimizu, Tokyo (JP); Hirofumi Motoshiromizu, Tokyo (JP); Eisuke Kamide, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/251,040

(22) Filed: Aug. 30, 2016

(65) Prior Publication Data

US 2017/0061947 A1  Mar. 2, 2017

(30) Foreign Application Priority Data

Aug. 31, 2015 (JP) .................. 2015-169974

(51) Int. Cl.
*G10K 11/16* (2006.01)
*H01J 37/16* (2006.01)

(52) U.S. Cl.
CPC .............. *H01J 37/16* (2013.01); *G10K 11/16* (2013.01); *H01J 2237/0216* (2013.01)

(58) Field of Classification Search
CPC . G10K 11/162; H01J 37/16; H01J 2237/0216

USPC .................................................. 181/202, 198
See application file for complete search history.

(56) References Cited

U.S. PATENT DOCUMENTS

| 8,170,255 | B2 * | 5/2012 | Visscher ............... E04B 1/8209 381/345 |
| 8,822,952 | B2 * | 9/2014 | Muto .................... G10K 11/172 250/441.11 |
| 9,418,818 | B2 * | 8/2016 | Ominami ................. H01J 37/16 |
| 2014/0008143 | A1 * | 1/2014 | Eberler ..................... F16F 7/00 181/202 |
| 2015/0041676 | A1 * | 2/2015 | Muto ...................... H01J 37/26 250/453.11 |

FOREIGN PATENT DOCUMENTS

| JP | 2007-226216 A | 9/2007 |
| JP | 2013-191333 A | 9/2013 |
| JP | 5537386 B2 | 7/2014 |

* cited by examiner

*Primary Examiner* — Forrest M Phillips
(74) *Attorney, Agent, or Firm* — Crowell & Moring LLP (57) ABSTRACT

To provide a charged particle radiation apparatus including a soundproof cover that highly realizes both suppression of image defects due to a specific frequency and improvement in quake resistance. A charged particle radiation apparatus including a box-shaped soundproof cover having a plurality of wall surfaces, the soundproof cover including a plurality of columnar bodies forming a frame of the box shape body and a box-shaped acoustic energy absorbing structure provided in a connecting part of the plurality of columnar bodies and attached to support at least the two columnar bodies, is proposed.

8 Claims, 7 Drawing Sheets

CHARGED PARTICLE RADIATION APPARATUS

CLAIM OF PRIORITY

The present application claims priority from Japanese patent application JP 2015-169974 filed on Aug. 31, 2015, the content of which is hereby incorporated by reference into this application.

TECHNICAL FIELD

This invention relates to a charged particle radiation apparatus including a soundproof cover, and specifically to a charged particle radiation apparatus including a soundproof cover having higher sound insulation performance over a wider frequency range.

BACKGROUND ART

In a charged particle radiation apparatus represented by an electron microscope, on the basis of scanning with an electron beam or the like, a microstructure is observed with high resolution using detected detection signals. With the higher resolution, influences by micro vibration, sound, electromagnetic wave, etc. from outside are becoming obvious. As measures for image defects produced based on installation environment sound, placement of a soundproof cover to surround the apparatus is considered.

By the placement of the soundproof cover, transmission of acoustic wave is blocked and, particularly, the influence by the transmission of the high-frequency acoustic wave may be suppressed. As specific structures of the soundproof cover, PTL 1 describes a method for addressing by disposing within the cover a first noise absorber which provides noise absorbing performance specialized for the natural frequency of the apparatus and a second noise absorber specialized for the frequencies of acoustic standing waves generated within the cover. Further, PTL 2 describes a soundproof cover including a cylindrical body on an inner wall. Furthermore, PTL 3 describes a method of providing an acoustic damping material having each of longitudinal, lateral, height dimensions equal to ¼ of the dimension of the cover at a corner of the cover.

CITATION LIST

Patent Literatures

PTL 1: Japanese Patent No. 5537386 (Counterpart U.S. Pat. No. 8,822,952)
PTL 2: JP-A-2013-191333 (Counterpart Published Application USP 2015/0041676)
PTL 3: JP-A-2007-226216 (Counterpart U.S. Pat. No. 8,170, 255)

SUMMARY OF INVENTION

Technical Problems

On the other hand, the influence of the low-frequency acoustic wave may be larger due to the placement of the cover. The influence by the existence of the acoustic standing waves generated within the cover is considered for this.

When the charged particle radiation apparatus main body is vibrated by the sound pressure applied to its outer surface, it is considered that the image defects are proportional to the vibration displacement of the apparatus. Generally, when random excitation force having a frequency property as a constant value is applied to an object and the object vibrates, the vibration displacement is inversely proportional to the square of the frequency with respect to the excitation force. In other words, in the case where random noise with uniform frequency property is applied to the apparatus main body, generally, the image defects are produced more likely at the lower frequency and the acoustic standing waves within the cover are generated due to placement of the cover as described above, and thereby, the image defects may be deteriorated.

PTL 1 focuses on the natural frequency of the apparatus itself and the generation frequencies of the acoustic standing waves generated within the cover, and describes an example in which the acoustic energy absorbing structures providing noise absorbing performance specialized for the respective frequencies are disposed on the inner entire surface within the ceiling surface of the cover 20 and the side surface of a sample transfer device 12. However, it is not preferable to dispose the acoustic energy absorbing structure on the entire ceiling surface in view of weight, cost, workability, and maintenance. It is desirable to dispose the structure in a more limited and specific part if possible, however, PTL 1 does not mention any specific part and disposing method for the structure.

PTL 2 shows the structure in which the cylindrical acoustic energy absorbing structures with one end opened and the other end closed are arranged on the inner surface of the cover. In the literature, the acoustic standing waves within the cover to be addressed are limited to second standing waves in the longitudinal direction of the cover and attention is focused on the size of the cover in the longitudinal direction equal to the wavelength, and the cylindrical acoustic energy absorbing structures having lengths of ¼ of the length of the cover in the longitudinal direction are arranged with their opening portions located in the ends of the cover in the longitudinal direction and near the center of the cover. However, the structure is very huge and not preferable in consideration of employment for real products in view of cost effectiveness.

PTL 3 shows the structure including the acoustic energy absorber having the size of about ¼ of the representative dimensions of the cover with respect to the interior of the cover, however, generally, the case where there is such a large space within the cover is very rare and the applicability is not so high.

As described above, according to these methods shown in Background Art, relatively large-scaled sound-absorbing mechanisms are mounted within the covers and not preferable in view of cost and workability and in view of ease of opening and closing of the cover in consideration of maintenance. It is desirable to provide a structure that suppresses the influence on the other performance of the apparatus and efficiently exerts sound absorption effect when the soundproof cover is placed. More specifically, there is a demand for a charged particle radiation apparatus including a soundproof cover that prevents image defects produced by installation environment sound, the soundproof cover suppressing production of image defects evenly in a wide frequency range, having dust resistance that endures use in a clean room as an installation environment of the charged particle radiation apparatus, and further avoiding damage on a cover opening and closing mechanism for maintenance.

As below, a charged particle radiation apparatus including a soundproof cover intended to highly realize both suppression of image defects due to a specific frequency and improvement in quake resistance will be proposed.

Solution to Problems

A charged particle radiation apparatus including a box-shaped soundproof cover having a plurality of wall surfaces, the soundproof cover including a plurality of columnar bodies forming a frame of the box shape body and a box-shaped acoustic energy absorbing structure provided in a connecting part of the plurality of columnar bodies and attached to support at least the two columnar bodies, and the acoustic energy absorbing structure having at least one opening provided inside the soundproof cover, is proposed.

Advantageous Effects of Invention

According to the above described configuration, both suppression of image defects due to a specific frequency and improvement in quake resistance can be realized.

DESCRIPTION OF EMBODIMENT

As below, a charged particle radiation apparatus including a soundproof cover that may highly realize both suppression of image defects due to a specific frequency and improvement in quake resistance will be explained using the drawings. Further, according to the example structure to be explained below, downsizing of an installation volume can be also realized.

Figure 1:
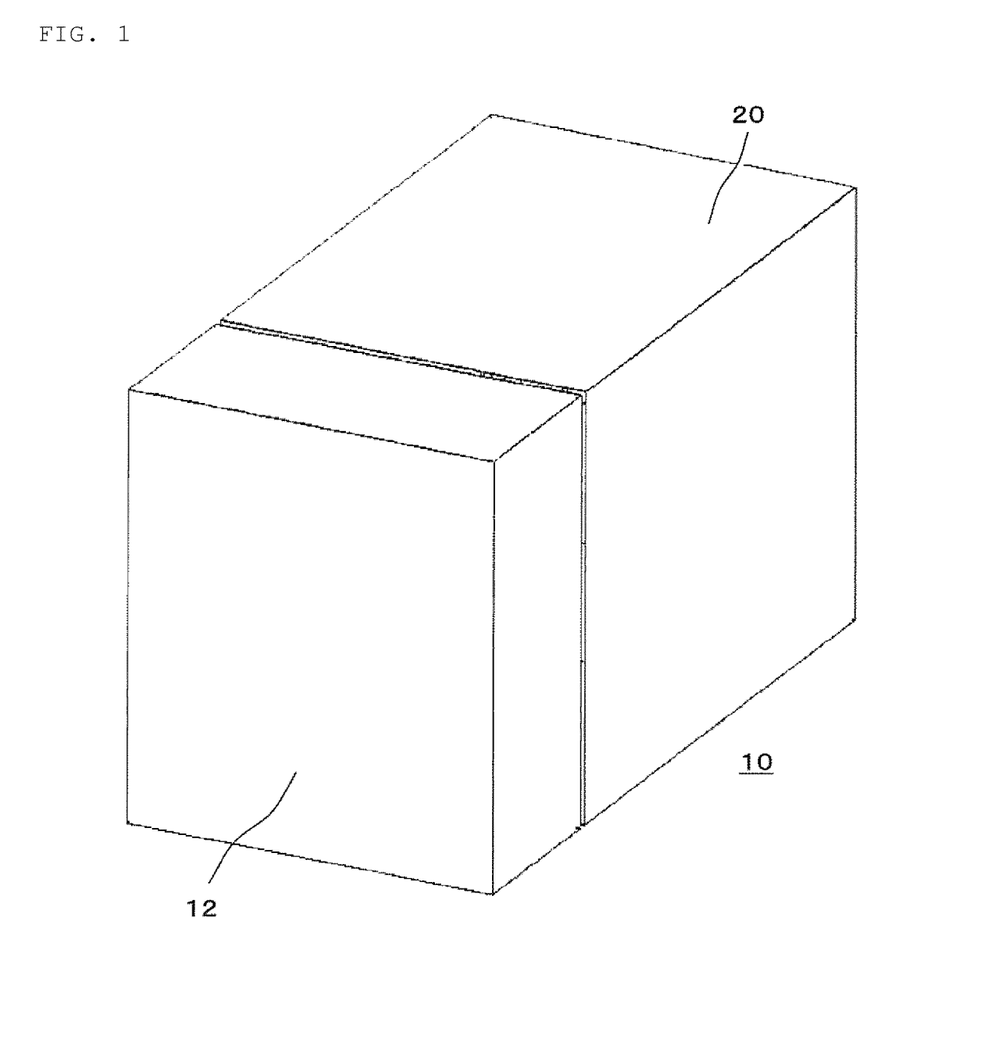
FIG. 1 is a perspective view of a charged particle radiation apparatus over which a soundproof cover is placed.
Figure 2:
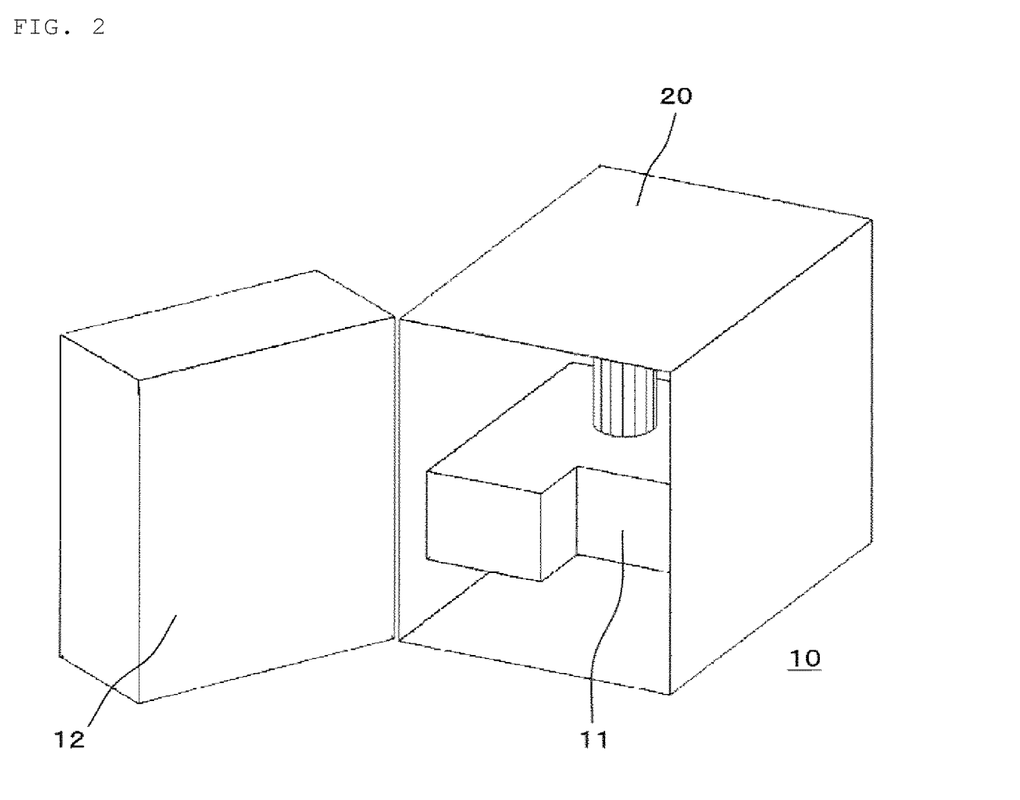
FIG. 2 is a perspective view of the charged particle radiation apparatus from which a sample transfer device is detached.

A configuration of a soundproof cover placed for the charged particle radiation apparatus will be explained using FIGS. 1 to 3. FIG. 1 shows an example of the soundproof cover placed for the charged particle radiation apparatus. When a charged particle radiation apparatus 10 such as a length measuring SEM (Critical Dimension-Scanning Electron Microscope: CD-SEM) is seen from outside, a soundproof cover 20 having a plurality of wall surfaces and a sample transfer device 12 such as a mini-environment are seen. The sample transfer device 12 is formed independently of the soundproof cover 20 and a housing 11 and movable. When the device is moved as shown in FIG. 2, the housing 11 (electron microscope) is provided inside of the soundproof cover 20. Further, the housing 11 is formed by various devices including a column 11a, an ion pump 11b, a sample chamber 11c, etc.

Note that the sample transfer device 12 largely vibrates due to a fan or the like mounted thereon and it is desirable not to transmit the vibration to the housing. Further, various devices are attached to the housing and, if their waste heat is accumulated within the cover, the housing thermally expands and a phenomenon called "thermal drift" that the field of view of the electron microscope shifts is caused, and it is necessary to provide an opening for exhausting heat within the cover. On this account, as described above, the sample transfer device 12 is provided separately from the soundproof cover 20 and the housing 11 with a gap in between. However, despite of the placement of the cover for preventing radiation of the external environment sound to the housing 11, sound leakage from the gap between the sample transfer device 12 and the soundproof cover 20 and the housing 11 flows into the cover. Further, the most part around the housing 11 is covered from outside by the cover 20, and thereby, acoustic standing waves as shown in FIG. 3 are generated within the cover.

The sound leakage from the gap between the sample transfer device 12 and the soundproof cover 20 and the housing 11 may efficiently stimulate the acoustic standing waves and promote the generation of the standing waves, increase the sound pressure applied to the surface of the housing, and further deteriorate image defects. Note that FIG. 3 shows only the acoustic standing waves with a combination of second standing waves in upward and downward directions and second standing waves in frontward and rearward directions (rightward and leftward directions on the paper surface), however, actually, various forms of acoustic standing waves are excited at frequencies according to the forms.

In the example to be explained below, as a specific configuration for handling standing waves of various forms, a charged particle radiation apparatus including a soundproof cover in which, with respect to eight vertices of the space inside of the cover formed in a nearly rectangular shape, on the inner surfaces of the cover near the vertices, sound absorbing surfaces of pressure-driven acoustic energy absorbing structures are set in parallel to the respective three faces forming the vertices will be described.

The plurality of acoustic energy absorbing structures are provided to surround the charged particle radiation apparatus and the acoustic standing waves generated within the soundproof cover are positively absorbed, and thereby, image defects produced due to the installation environment sound in the charged particle radiation apparatus maybe improved over a wide frequency range and dust resistance that endures use in a clean room as an installation environment of the charged particle radiation apparatus and ease of opening and closing of the cover in consideration of maintenance may be realized without damage.

Figure 4:
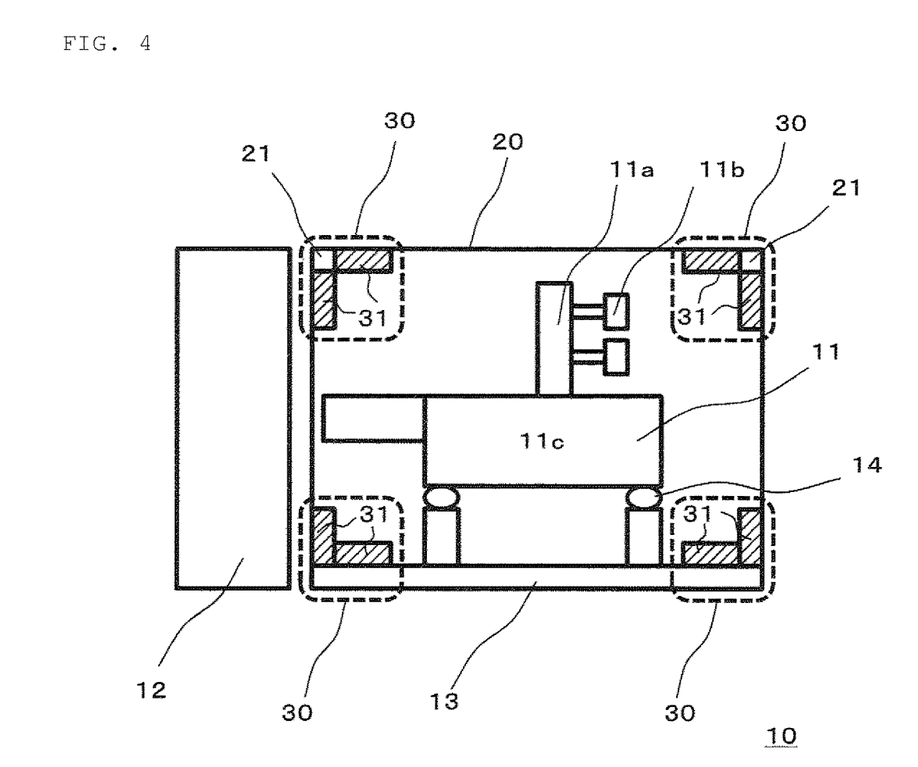
FIG. 4 shows an example in which acoustic energy absorbing structures are provided within the soundproof cover.

As below, the charged particle radiation apparatus in which the plurality of acoustic energy absorbing structures are provided will be explained using the drawings. FIG. 4 shows an example of the charged particle radiation apparatus including the soundproof cover provided with the plurality of acoustic energy absorbing structures. As shown in the drawing, with respect to eight vertices of the internal space formed in the nearly rectangular shape partitioned by the cover 20, on the inner surfaces of the cover near the vertices (corner parts within cover 30), sound absorbing surfaces of pressure-driven acoustic energy absorbing structures 31 are provided in parallel to the respective three faces forming the vertices. Note that the sound absorbing surfaces of the pressure-driven acoustic energy absorbing structures 31 face inward of the cover.

Figure 3:
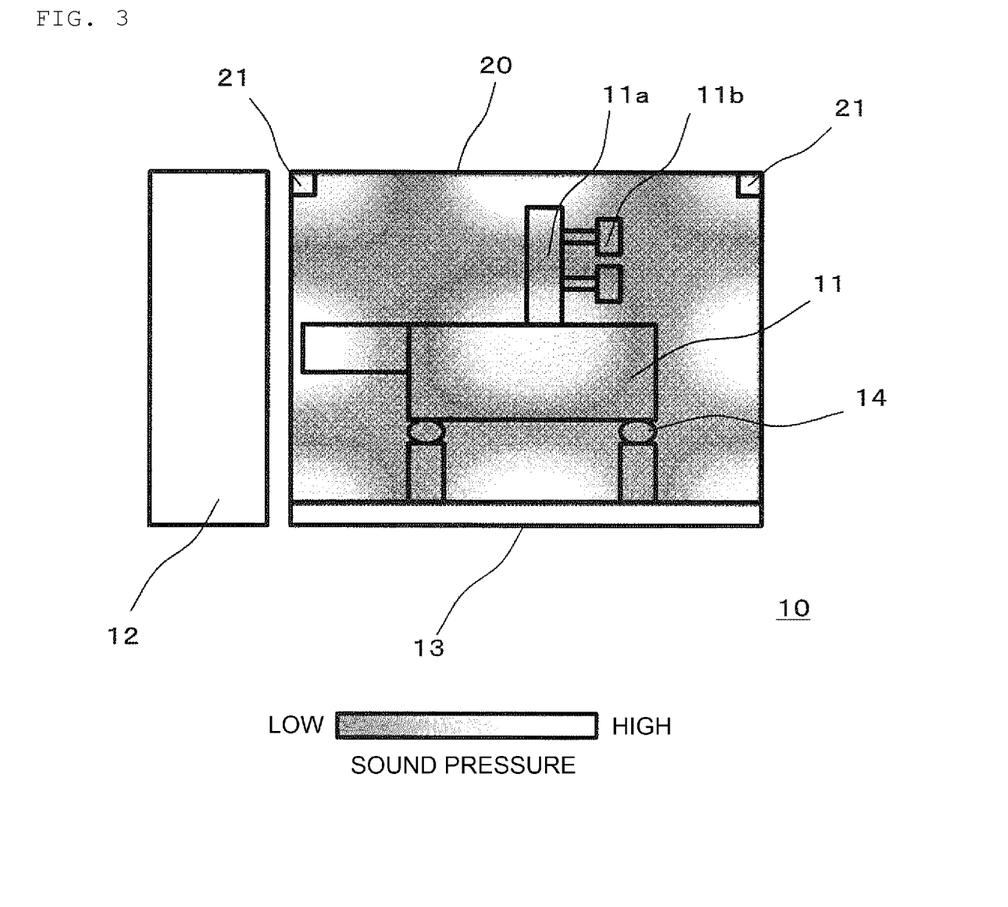
FIG. 3 shows an example of a sound pressure distribution within the soundproof cover.

As shown in FIG. 3, the acoustic standing waves are generated within the cover at low frequencies. The acoustic standing wave shows a form having a distribution of antinodes and nodes of sound pressure and a particle velocity of a gas. Unless the excitation method is special, a plurality of various acoustic standing waves are simultaneously generated at frequencies determined by the forms. The acoustic standing waves illustrated in FIG. 3 are a combination of second standing waves in upward and downward directions and second standing waves in frontward and rearward directions (rightward and leftward directions on the paper surface) as one of them, and the positions of the antinodes and the nodes of the sound pressure differ among the respective standing waves. However, regarding the plurality of standing waves, antinodes of sound pressure are inevitably located in the positions shown by broken lines in FIG. 4, the so-called corner parts 30 within the cover. This is because the gas within the cover can not vibrate in any direction at the points and the sound waves propagating within the cover are inevitably reflected in the corner parts within the cover and provide pressure in the sum of incident waves and reflected waves. On the other hand, in the flat surface parts of the cover, the gas closer to the parts can vibrate within the in-plane direction of the cover and the waves incident in parallel to the cover surface may be passed as it is, and antinodes of sound pressure are not constantly located there.

In view of the phenomenon, the sound absorbing structures are provided in the corner parts 30 within the cover, and thereby, sound reflection may be suppressed. As a result, generation of all acoustic standing waves may be suppressed. Note that, when the sound absorbing structures are provided, it is necessary to sufficiently consider the provision space. For example, in a sound absorbing structure of a general porous material, a thickness of about ¼ of the wavelength determined by a frequency desired to be absorbed is necessary. This is because the sound absorbing structure is a "velocity-driven" acoustic energy absorbing structure having an effect of suppressing the vibration velocity of the gas vibration causing sound, and, on the other hand, the vibration velocity of the acoustic standing wave is at the node near the wall surface and the antinode of the vibration velocity is located in the position of the quarter wavelength from the wall surface. However, an acoustic energy absorber having a size of about ¼ of the dimensions of the soundproof cover occupies a considerable space of the space within the cover and its application is difficult in view of the provision space.

On the other hand, when the pressure-driven acoustic energy absorbing structures 31 as illustrated in the example are applied, if the structures are provided to be thin in the corner parts within cover 30 in which the antinodes of the pressure within the cover are located, the structures have sufficient effects. In addition, the interior of the cover is concave as seen from the inner surfaces of the cover, and, if the sound absorbing surfaces of the pressure-driven acoustic energy absorbing structures 31 are set in parallel to the respective three faces forming the corner parts, the absorbing areas may be secured and improvement in efficiency may be expected. Note that the pressure-driven acoustic energy absorbing structure includes a piezoelectric material and a Helmholtz resonator.

Figure 5:
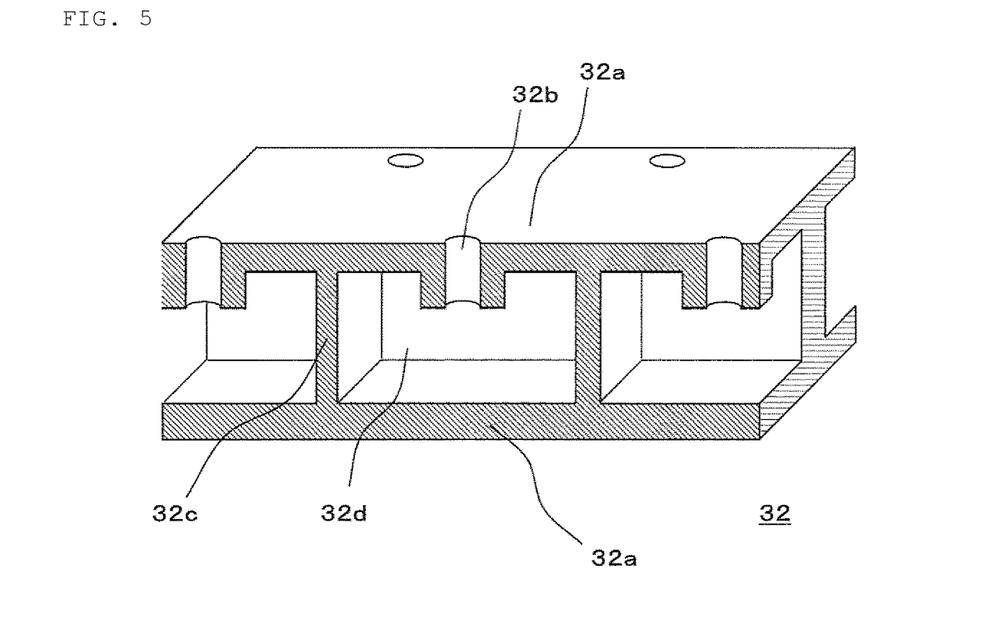
FIG. 5 shows an inner structure example of the acoustic energy absorbing structure.

FIG. 5 shows an internal structure of the acoustic energy absorbing structure illustrated in FIG. 4 or FIGS. 8 and 9, which will be described later. The pressure-driven acoustic energy absorbing structure 31 having the structure is attached to the corner part within cover 30 and formed by a porous plate sound absorbing mechanism 32. The porous plate sound absorbing mechanism includes two plates 32a provided in parallel and a partition wall 32c. An opening 32b is provided on the sound absorbing surface side of the plate 32a and a cavity portion 32d is formed by connection of the two plates 32a and the partition wall 32c. The acoustic energy absorbing structure having the structure functions as the pressure-driven acoustic energy absorbing structure. The pressure-driven acoustic energy absorbing structure 31 having the structure is selectively provided in the cover corner parts 30 in FIG. 4, and thereby, the structure may be formed at the lower cost than that using a piezoelectric material and more simply and easily worked than that using a Helmholtz resonator.

Figure 6:
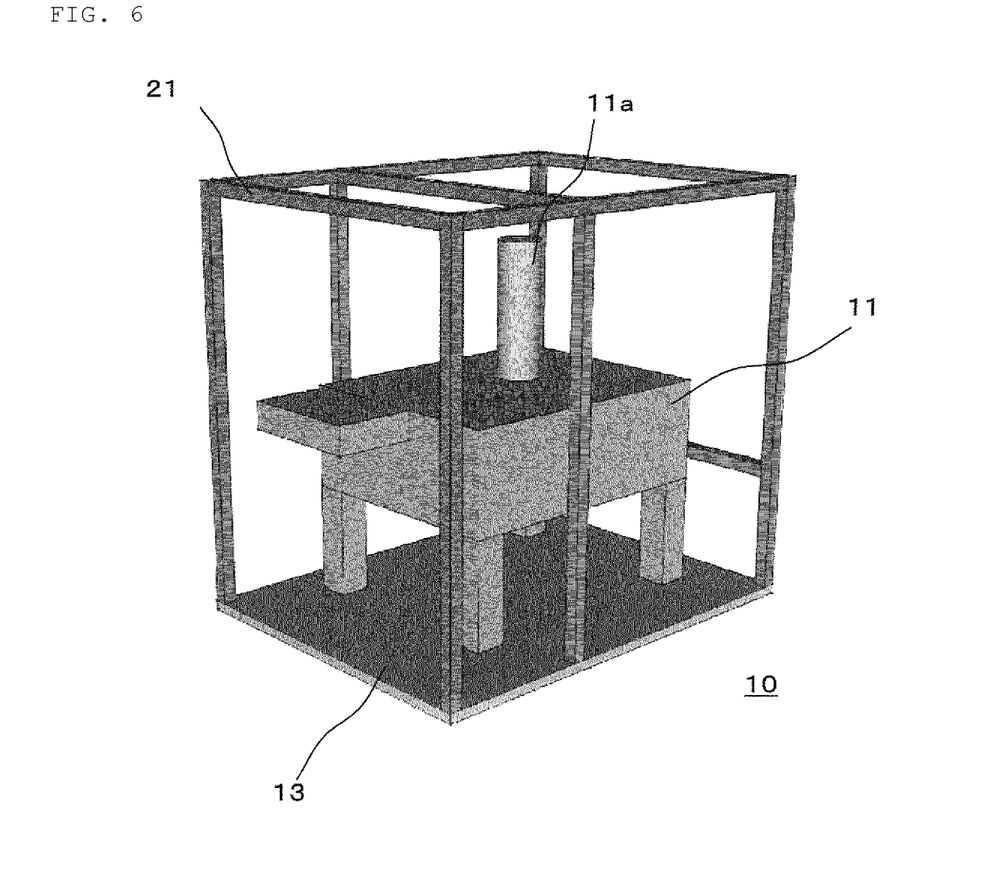
FIG. 6 shows an example of a frame structure for attachment of the soundproof cover.
Figure 7:
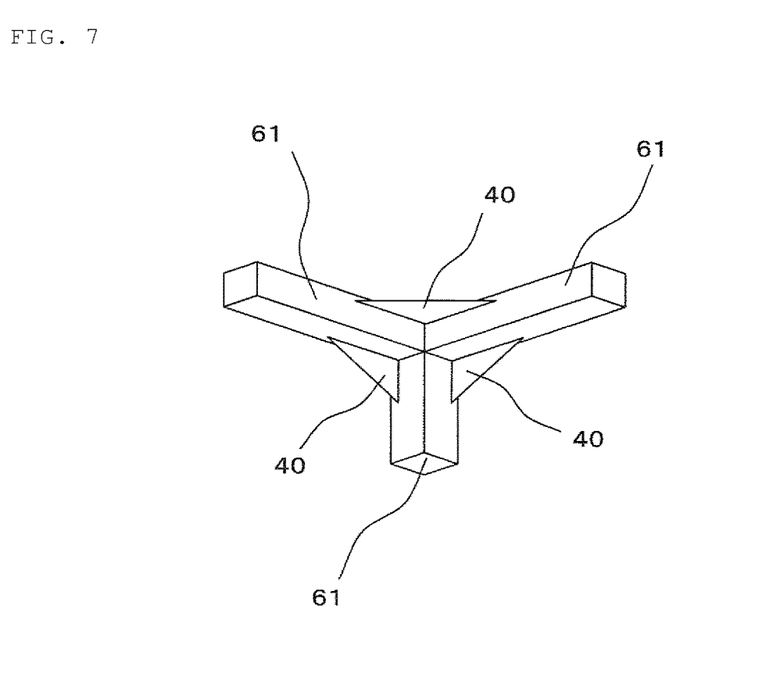
FIG. 7 shows a structure example for connecting between columnar members of the frame structure.
Figure 8:
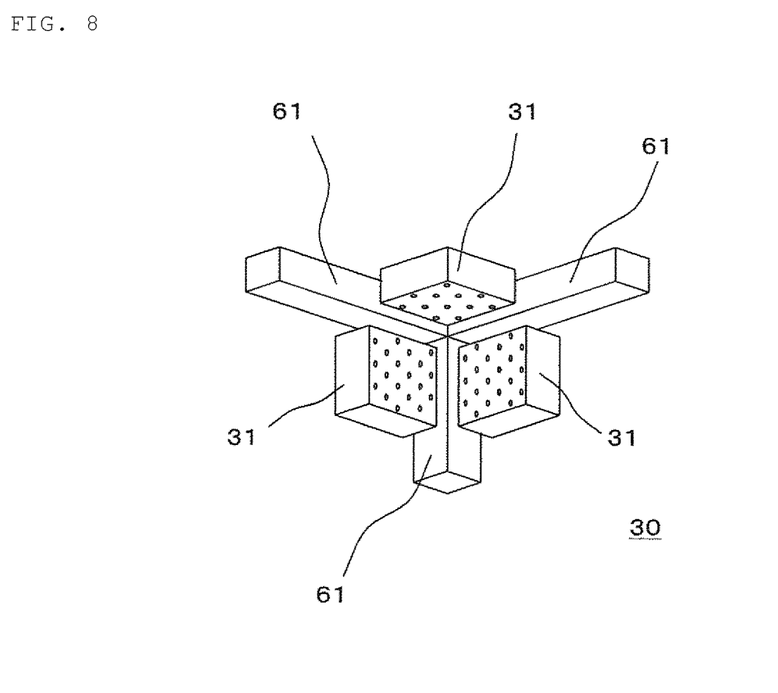
FIG. 8 shows an example in which the acoustic energy absorbing structures are provided in a frame fastening part.

More specific configurations of the example are explained using FIGS. 6 to 8. FIG. 6 illustrates a frame for attachment of the cover 20 of the charged particle radiation apparatus 10. The frame is formed by a plurality of columnar bodies 61. The cover 20 is attached to a hinge provided in the frame and placed to have an opening and closing mechanism. Thereby, at maintenance of the apparatus, an approach to the housing can be made. In the frame structure as shown in FIG. 6, the columnar bodies 61 should be strongly fastened to one another not to change the relative positions of the columnar bodies 61 in the parts in which the columnar bodies 61 are coupled (joints), and it is desirable to provide brace structures 40 as illustrated in FIG. 7 in the joints of the columnar bodies 61 for achieving the fastening.

FIG. 8 shows an example in which the porous plate sound absorbing mechanisms 32 are provided in the connecting part of the columnar bodies in place of or in combination with the brace structures as illustrated in FIG. 7. Rectangular parallelepiped bodies (acoustic energy absorbing structures 31) are formed using the porous plate sound absorbing mechanisms 32 as illustrated in FIG. 5 and the rectangular parallelepiped bodies are placed on the eight vertices of the space within the cover. Further, at the placement, the rectangular parallelepiped body is placed on the inner surfaces of two columnar members as the connecting parts of the columnar bodies 61. Further, the rectangular parallelepiped body supports at least two columnar bodies 61 and is placed to fix both of them. FIG. 8 shows an example in which the acoustic energy absorbing structures 31 are respectively provided between the columnar bodies having longitudinal directions in the upward and downward directions and the columnar bodies having longitudinal directions in the frontward and rearward directions, between the columnar bodies having longitudinal directions in the upward and downward directions and the columnar bodies having longitudinal directions in the leftward and rightward directions, and between the columnar bodies having longitudinal directions in the frontward and rearward directions and the columnar bodies having longitudinal directions in the leftward and rightward directions. If the three acoustic energy absorbing structures 31 are provided in each of the eight corner parts of the soundproof cover, the acoustic standing waves can be absorbed by the 24 acoustic energy absorbing structures 31.

Further, the acoustic energy absorbing structure 31 is formed using a hard metal member of aluminum or stainless steel, and thereby, both the absorption of the acoustic standing waves and the higher rigidity of the soundproof cover may be realized and the propagation of the vibration derived from sound or the like to the charged particle radiation apparatus can be highly suppressed by the relatively simple structure. The acoustic energy absorbing structures 31 may suppress variations of relative angles of two or more columnar members as braces, and thus, the above-described improvement in quake resistance can be realized.

Note that at least one opening provided toward inside of the soundproof cover enables absorption of the acoustic standing waves, however, it is desirable to provide a plurality of openings as illustrated in FIG. 5 as porous members and provide the cavity portions 32d with respect to the plurality of openings. Thereby, the porous plate sound absorbing mechanisms 32 may effectively suppress the acoustic standing waves in the internal space of the cover 20 while having the functions of the brace structures 40. In this regard, it is preferable to set the sound absorbing surfaces of the porous plate sound absorbing mechanisms 32 in parallel to the respective three faces forming the vertices of the space within the cover.

Figure 9:
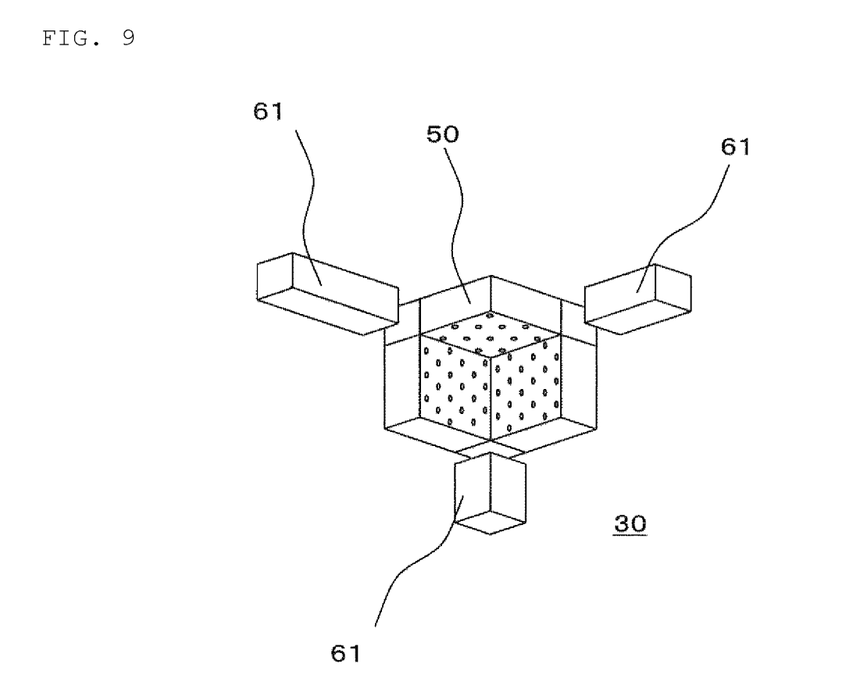
FIG. 9 shows an example in which the columnar members are connected using acoustic energy absorbing structures.

FIG. 9 shows an example of forming a frame fastening member 50 by combining a plurality of (three in the example) porous plate sound absorbing mechanisms 32 shown in FIG. 5. In the configuration, a plurality of holes into or from which the frame can be inserted or removed for attachment are provided and the columnar bodies 61 forming the frame are inserted here, and thereby, the frame of the soundproof cover is formed. The frame fastening member 50 is formed by the three acoustic energy absorbing structures and the acoustic standing waves may be effectively absorbed, and further functions as the braces for the plurality of columnar bodies 61 and the vibration factors of the apparatus including the acoustic standing waves can be suppressed by the relatively simple configuration. In the example of FIG. 8, the porous plate sound absorbing mechanisms 32 are used in replace of the braces 40 to provide the functions of fastening the frames. In the example of FIG. 9, the frame fastening member 50 is formed by the porous plate sound absorbing mechanisms 32 in advance and the frames are fitted in them, and thereby, high suppression of image defects based on realization of both the suppression of the acoustic standing waves and the improvement in quake resistance is realized.

Further, since the locations where the acoustic standing waves are generated and the locations where the braces should be provided are nearly the same, the acoustic energy absorbing structures 31 having the functions of both are placed in proper positions, and thereby, the measures for the two phenomena may be realized by one member (acoustic energy absorbing structures 31) and increase in weight can be suppressed. As a result, the soundproof cover robust to disturbances can be provided.

REFERENCE SIGNS LIST 10 charged particle radiation apparatus
11 housing
11a column
11b ion pump
11c sample chamber
12 sample transfer device
13 base
14 vibration isolating damper
20 soundproof cover
21 frame
30 corner part within cover
31 pressure-driven acoustic energy absorbing structure
32 porous plate sound absorbing mechanism
32a surface plate portion
32b opening portion
32c partition wall
32d cavity portion
40 brace structure
50 frame fastening member
61 columnar body

The invention claimed is:

1. A charged particle radiation apparatus comprising a box-shaped soundproof cover having a plurality of wall surfaces, the soundproof cover including a plurality of columnar bodies forming a frame of the box shape body and a box-shaped acoustic energy absorbing structure provided in a connecting part of the plurality of columnar bodies and attached to support at least the two columnar bodies.

2. The charged particle radiation apparatus according to claim 1, wherein the acoustic energy absorbing structure has the box shape and is provided to support the two columnar bodies by two faces of the box shape.

3. The charged particle radiation apparatus according to claim 1, wherein the acoustic energy absorbing structure is formed by connecting a plurality of box-shaped bodies and the connected structure is formed to support at least the two columnar bodies.

4. The charged particle radiation apparatus according to claim 1, wherein the acoustic energy absorbing structure is a brace for at least the two columnar bodies.

5. The charged particle radiation apparatus according to claim 1, wherein at least one opening is provided on a side surface of the acoustic energy absorber inside the soundproof cover.

6. The charged particle radiation apparatus according to claim 1, wherein a plurality of cavity portions are provided in the acoustic energy absorbing structure and at least one opening is provided in the cavity portion.

7. The charged particle radiation apparatus according to claim 1, wherein the acoustic energy absorbing structure is provided to support both of the two columnar bodies connected to form the frame and respectively provided between the adjacent columnar bodies.

8. The charged particle radiation apparatus according to claim 1, wherein the acoustic energy absorbing structure is provided on each of eight vertices of the box-shaped soundproof cover.

* * * * *